(12) United States Patent
Syed et al.

(10) Patent No.: US 12,046,282 B2
(45) Date of Patent: Jul. 23, 2024

(54) DEVICE WITH RECONFIGURABLE SHORT TERM DATA RETENTION

(71) Applicant: International Business Machines Corporation, Armonk, NY (US)

(72) Inventors: Ghazi Sarwat Syed, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 17/813,650

(22) Filed: Jul. 20, 2022

(65) Prior Publication Data

US 2024/0029790 A1    Jan. 25, 2024

(51) Int. Cl.
    *G11C 13/00* (2006.01)
(52) U.S. Cl.
    CPC ...... *G11C 13/0069* (2013.01); *G11C 13/0004* (2013.01); *G11C 13/0061* (2013.01); *G11C 13/0064* (2013.01)

(58) Field of Classification Search
    None
    See application file for complete search history.

(56) References Cited

U.S. PATENT DOCUMENTS

| | | |
|---|---|---|
| 7,199,394 B2 | 4/2007 | Mandell |
| 10,496,829 B2 | 12/2019 | Li |
| 2008/0080226 A1 | 4/2008 | Mikolajick |
| 2012/0039117 A1* | 2/2012 | Webb ............ G11C 13/0004 365/163 |

FOREIGN PATENT DOCUMENTS

KR    20190089279 A    7/2019

OTHER PUBLICATIONS

Patent Cooperation Treaty, "International Search Report", International Application No. PCT/IB2023/056032, International Filing Date Jun. 12, 2023, 10 pages.
Qiu et al., "Write Mode Aware Loop Tiling for High Performance Low Power Volatile PCM in Embedded Systems", IEEE Transactions on Computers, vol. 65, No. 7, Jul. 2016, 12 pages.

(Continued)

*Primary Examiner* — Tan T. Nguyen
(74) *Attorney, Agent, or Firm* — Aaron N. Pontikos (57) ABSTRACT

The invention is notably directed to a device comprising a plurality of resistive memory elements. The plurality of resistive memory elements comprises a resistive material. The device is configured to apply programming pulses to a subset of the plurality of resistive memory elements to perform a temporary resistance change of the resistive material of the subset for a predefined retention period, thereby programming the subset of the plurality of resistive elements from a first resistance state corresponding to a first binary state to a second resistance state corresponding to a second binary state. The device is configured such that a resistance of the subset of the plurality of resistive elements reverts automatically during the predefined retention period from the second resistance state to the first resistance state by an inherent material property of the resistive material, thereby automatically deleting the second binary state.

20 Claims, 8 Drawing Sheets

(56) References Cited

OTHER PUBLICATIONS

Authors et al.: Disclosed Anonymously, "Method And System for an Optimized Secure Erase of data on Non-Volatile Data Storage Devices", An IP.com Prior Art Database Technical Disclosure, IP.com No. IPCOM000205100D, IP.com Electronic Publication Date: Mar. 15, 2011, 4 Pages.

Noor, Nafisa, "Exploiting Phase Change Memory Nano-device Properties for Hardware Security Applications", University of Connecticut, Mar. 16, 2019, 183 Pages.

\* cited by examiner

DEVICE WITH RECONFIGURABLE SHORT TERM DATA RETENTION

BACKGROUND

The present invention relates generally to the field of data security, and more particularly to a device with reconfigurable short term data retention.

Data security/protection is the practice of protecting digital information from corruption, unauthorized access, or theft. The latter two are particularly becoming more and more relevant. For example, platforms such as social media not only provide users with the ability to auto-delete their posted (uploaded) data from the cloud, but also an option to define a time period to schedule the delete. In other applications, such as cache memories and encryption, data destruction is also needed to prevent hacking threats of important files, such as passwords.

In modern systems, timer circuits and memory buffers are used for timed deletion of data. Modern computers use oscillator circuits to implement timers. These are usually large circuits.

SUMMARY

According to an aspect, the invention is embodied as a device comprising a plurality of resistive memory elements. The plurality of resistive memory elements comprises a resistive material. The device is configured to apply programming pulses to a subset of the plurality of resistive memory elements to perform a temporary resistance change of the resistive material of the subset for a predefined retention period, thereby programming the subset of the plurality of resistive elements from a first resistance state corresponding to a first binary state to a second resistance state corresponding to a second binary state. The device is configured such that a resistance of the subset of the plurality of resistive elements reverts automatically during the predefined retention period from the second resistance state to the first resistance state by an inherent material property of the resistive material, thereby automatically deleting the second binary state.

According to another aspect, a design structure is provided. The design structure is tangibly embodied in a machine-readable medium for designing, manufacturing, or testing an integrated circuit. The design structure comprises a device according to the previous device aspect.

According to another aspect, a method for performing a short-term retention of data by a device comprising a plurality of resistive elements is provided. The plurality of resistive elements comprises a resistive material. The method comprises applying programming pulses to a subset of the plurality of resistive elements to perform a temporary resistance change of the resistive material of the subset for a predefined retention period, thereby programming the subset of the plurality of resistive elements from a first resistance state corresponding to a first binary state to a second resistance state corresponding to a second binary state. The method further comprises automatically reverting during the predefined retention period from the second resistance state to the first resistance state by an inherent material property of the resistive material, thereby automatically deleting the second binary state.

Embodiments of the invention will be described in more detail below, by way of illustrative and non-limiting examples, with reference to the accompanying drawings.

BRIEF DESCRIPTION OF THE SEVERAL VIEWS OF THE DRAWINGS

FIGS. 11A, 11B, 11C, and 11D show device geometries of resistive elements that may be used according to embodiments of the invention, wherein

DETAILED DESCRIPTION

Embodiments of the present invention recognize the need for devices with short-term and tunable data retention ability. According to embodiments of the invention, a resistive element may be defined as an element whose electrical resistance can be changed by applying an electrical programming signal to the resistive element. The resistive element may be in particular embodied as resistive memory element. The electrical programming signal may be, e.g., a current flowing through the resistive memory element, or an electrical voltage applied to the resistive memory element. The current and/or voltage may be, e.g., applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures in which the metallic components serve as the electrodes and the insulator is a resistive switching material, e.g., a chalcogenide. These resistive memory elements exhibit good performance in terms of power consumption, integration density potential, retention, and endurance.

Phase change memory (PCM) is a fast-emerging non-volatile memory technology, both for data storage and computational memory applications, including neuromorphic computing. Traditionally PCM devices have required long-term retention ability. However, embodiments of the invention use select phase change material systems and harness their crystallization dynamics (amorphous to crystalline phase transitions) to implement memory devices with tunable short-term data retention applications. According to embodiments, the data retention times are a function of the starting amorphous volume of the phase change material and are therefore tunable by applying suitable write programming pulses, i.e., devices with larger amorphous volume take longer to crystallize and vice versa. Accordingly, embodiments of the invention provide devices with reconfigurable short term data retention.

According to embodiments, a self-destructive binary phase-change memory may be provided, in particular for data protection applications. According to embodiments, users may specify a retention time for programmed data, wherein the data can spontaneously erase without requiring an erase programming operation.

Embodiments of the invention may obviate the requirement for an external timer circuit and memory buffer, thus providing significant space and energy savings.

Embodiments of the invention may provide varying data retention times that can scale from μs to hours or even days.

Embodiments of the invention may be implemented by using conventional phase change device architectures and circuitry hardware.

Figure 1:
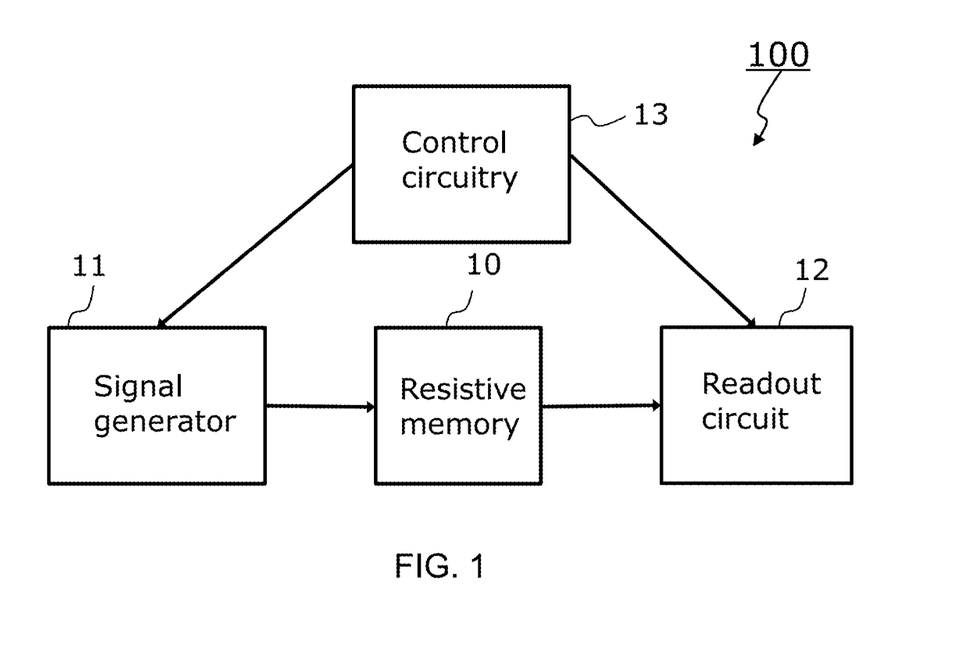
FIG. 1 is a simplified schematic block diagram of a device, according to an embodiment of the invention.

FIG. 1 is a simplified schematic block diagram of a device 100, according to an embodiment of the invention. The device 100 comprises a resistive memory 10 having a plurality of programmable resistive elements. Furthermore, a signal generator 11 is provided. The signal generator 11 is configured to apply electrical programming signals to the resistive elements of the resistive memory 10. The signal generator 11 comprises circuitry for programming the resistive memory cells during data write or programming operations. The signal generator 11 is configured to apply programming signals to the resistive elements to program conductance values of the resistive elements.

In addition, the device 100 comprises a readout circuit 12 configured to read out resistance values of the resistive elements during data read operations. The device 100 is configured to apply read out voltages to, e.g., rows of a memory crossbar array. The device is further configured to read out current values of columns of the memory crossbar array.

The device 100 further comprises control circuitry 13 configured to control the signal generator 11 and the readout circuit 12.

The memory 10 may be generally any kind of resistive memory as described above. In particular it may be a phase change memory (PCM) or a resistive random access memory (RRAM). In the following, it is assumed that the resistive memory 10 is embodied as PCM. Accordingly, the resistive memory 10 comprises a plurality of PCM cells as resistive memory elements. The PCM cells of memory 10 may comprise s=2 programmable resistance states. The programmable resistance states correspond to different relative proportions of the amorphous and crystalline phases within the PCM material of the cell. These states may include a high-resistance, fully-amorphous RESET state, a low-resistance, fully-crystalline SET state, and a number of intermediate partially amorphous RESET states corresponding to increasing size of the amorphous phase within the otherwise crystalline PCM material. The respective amorphous volume of the amorphous cell states corresponds to a predefined retention period of the corresponding RESET state.

Figure 2:
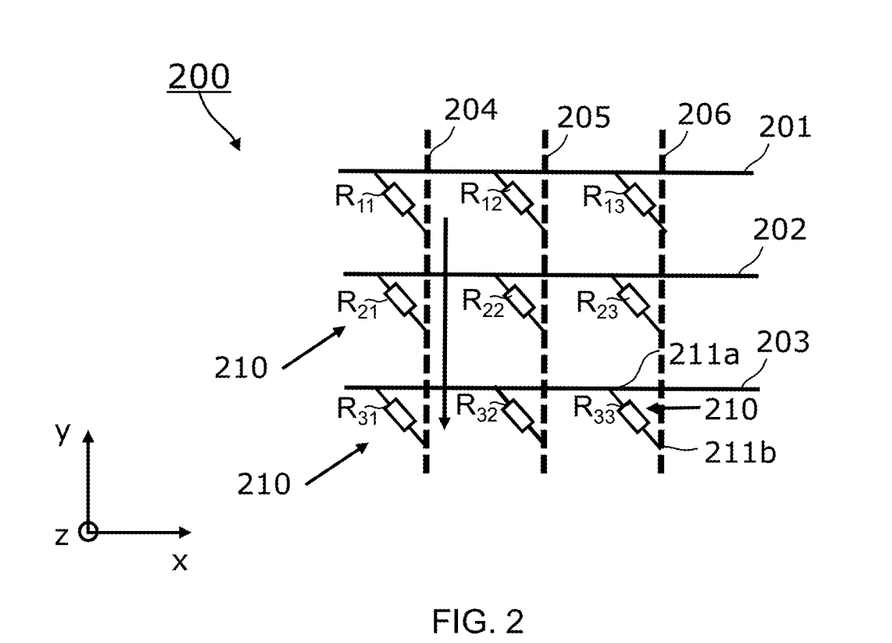
FIG. 2 shows a memory crossbar array, according to an embodiment of the invention.

FIG. 2 shows a memory crossbar array 200, according to an embodiment of the invention. The memory crossbar array 200 comprises three row lines 201, 202, and 203 and three column lines 204, 205, and 206. The three row lines 201, 202, and 203 are arranged above the three column lines 204, 205, and 206, which is indicated by dotted lines. More particularly, the row lines 201, 202, and 203 extend in a first x-y-plane and the three column lines extend in a second x-y plane, wherein the first x-y plane is arranged in the vertical z-direction above the second x-y-plane.

The three row lines 201, 202, and 203 and the three column lines 204, 205, and 206 are connected to each other via vertical junctions 210. The junctions 210 extend in the vertical z-direction between upper cross points 211a of the row lines 201-203 and lower cross points 211b of the column lines 204-206.

Each junction 210 comprises a serial arrangement of a resistive memory element and a transistor. For ease of illustration, the transistors are not shown in FIG. 2.

More particularly, the crossbar array 200 comprises nine resistive memory elements embodied as PCM cells. The row line 201 comprises resistive memory elements $R_{11}$, $R_{12}$, and $R_{13}$, the row line 202 comprises the memory elements $R_{21}$, $R_{22}$, and $R_{23}$, and the row line 203 comprises the memory elements $R_{31}$, $R_{32}$, and $R_{33}$.

In order to program the resistive elements, the signal generator 11 applies programming signals, in particular current pulses, to the resistive elements and thereby programs the conductance values.

In order to readout a respective conductance value, the readout circuit 12 may apply read voltages to the column lines 204, 205, and 206. Then, the readout circuit 12 reads out current values of the row lines 201, 202, and 203.

Figure 3:
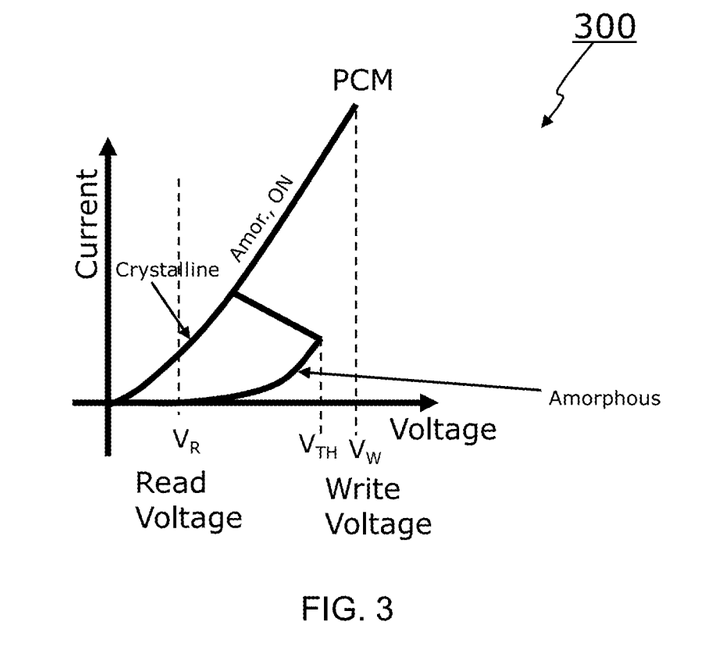
FIG. 3 is a schematic illustration of the current/voltage characteristics of the material components of a phase change memory cell, according to an embodiment of the invention.

FIG. 3 is a schematic illustration 300 of the current/voltage (and hence resistance) characteristics of the material components of a memory cell, e.g., the resistive element 400 of FIG. 4A below.

The solid lines indicate variation of current with voltage for the PCM material, starting from the fully-crystalline SET state (upper curve) and also the fully-amorphous RESET state (lower curve). These two curves reflect the large (typically three orders of magnitude) variation in resistivity between the crystalline and amorphous phases. The amorphous phase exhibits a non-linear characteristic with a threshold switching phenomenon that is field induced. At a certain threshold voltage $V_{TH}$, this phase switches to a very low "ON-state" resistance corresponding to that of the crystalline PCM material. The cell programming (write) voltage is selected to be above this threshold voltage as indicated.

As can be seen in FIG. 3, the current in the read mode is a slightly non-linear function of the voltage.

Figure 4A:
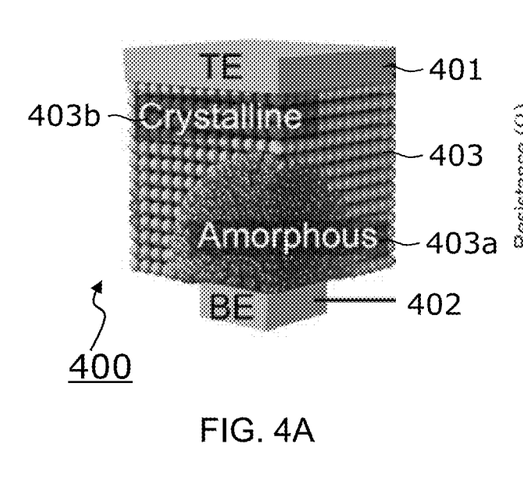
FIG. 4A shows an exemplary resistive element according to an embodiment of the invention.

FIG. 4A shows an exemplary resistive element 400, according to an embodiment of the invention. The resistive element 400 is embodied as a phase-change element and comprises a resistive material 403 that is arranged between a top electrode 401 and a bottom electrode 402. The resistive material 403 comprises a crystalline portion 403b and an amorphous portion 403a.

Figure 4B:
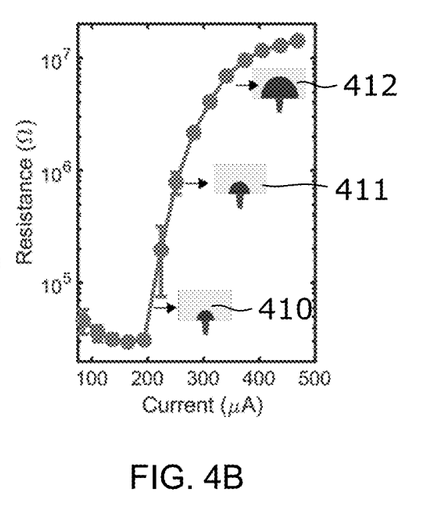
FIG. 4B illustrates an embodiment for exploiting crystallization dynamics in a nanoscale device, in particular the phase change element shown in FIG. 4A, according to an embodiment of the invention.

FIG. 4B illustrates an embodiment for exploiting crystallization dynamics in a nanoscale device, in particular in the phase change element 400 as shown in FIG. 4A. The phase change element shows Joule heating induced reversible phase transitions between amorphous and crystalline states in the phase-change material. The physical size of the phases, e.g., of the amorphous phase in the crystalline matrix can be controlled using the programming parameters, in particular the programming current.

The x-axis denotes the programming current in µA and the y-axis the resulting resistance of the phase change element in Ω. According to the illustrated example, the phase change element 400 is configured to program the phase change element to three different amorphous volumes 410, 411, and 412 and correspondingly to three different second resistance states corresponding to three second binary states with different retention periods. The first resistance state and a corresponding first binary state may be represented by a fully crystalline volume of the phase change element. The largest amorphous volume 412 corresponds to the longest retention period, the medium amorphous volume 411 corresponds to a medium retention period, and the smallest amorphous volume 410 corresponds to the shortest retention period.

Figure 5:
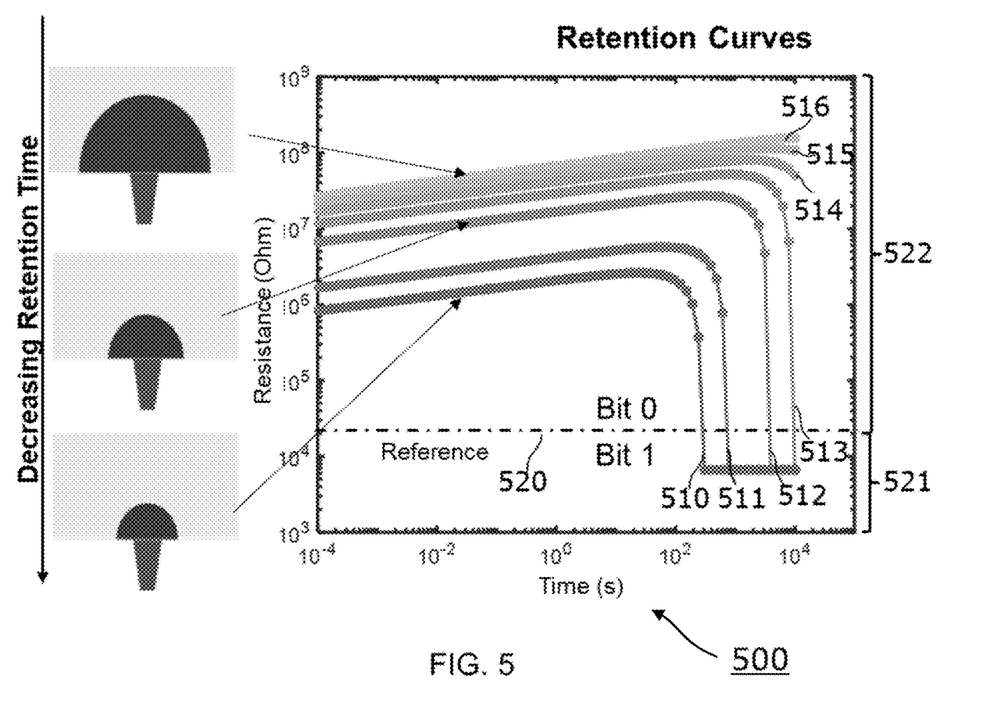
FIG. 5 illustrates in more detail the retention curves of resistive elements, according to embodiments of the invention, e.g., of the phase change elements as shown in FIG. 4A.

FIG. 5 shows an illustration 500 of the retention curves of resistive elements in more detail, according to embodiments of the invention, e.g., of the phase change element 400 as shown in FIG. 4A. The x-axis denotes the time in seconds after programming the phase change element 400 to a predefined amorphous volume. The y-axis denotes the resistance of the phase change element in Ω.

By applying programming pulses to the phase change element 400, a temporary resistance change of the resistive material for a predefined retention period may be achieved. More particularly, the phase change element 400 may be programmed from a first resistance state corresponding to a first binary state to a second resistance state corresponding to a second binary state. The first resistance state may correspond, e.g., to the binary state "Bit 1" and may encompass a resistance range 521 below a reference or threshold value 520, while the second resistance state may correspond, e.g., to the binary state "Bit 0" and may encompass a resistance range 522 above the reference or threshold value 520.

FIG. 5 shows seven retention curves 510, 511, 512, 513, 514, 515, and 516 each having a different initial second resistance state corresponding to a different amorphous volume. As can be seen in FIG. 5, the resistance value of the second resistance state evolves over time. More particularly, at first, it increases slightly over time due to relaxation. At the peak of the respective curves, the crystallization starts, and rather shortly after the crystallization starts, the resistance drops sharply. As soon as the resistance state passes the reference value 520, the corresponding resistive device reverts from the second resistance state to the first resistance state. This automatic reversal is performed by an inherent material property of the resistive material, more particularly by the crystallization dynamics of the corresponding phase change material. The automatic change of the resistance state from the second resistance state to the first resistance state automatically deletes the second binary state. In other words, the device returns automatically from "Bit 0" back to "Bit 1".

As can be seen by the different curves 510-516, devices programmed to "Bit 0" will become "Bit 1" after different retention periods depending on their starting resistance. Accordingly, devices according to embodiments of the invention store in the RESET state "Bit 0", and in the SET state "Bit 1". The RESET to SET operation is performed using a programming write electrical pulse. If this process occurs spontaneously by crystal growth, the data can self-destruct controllably. Such crystal growth indeed dominates in phase-change materials and in nanoscale devices.

Figure 6:
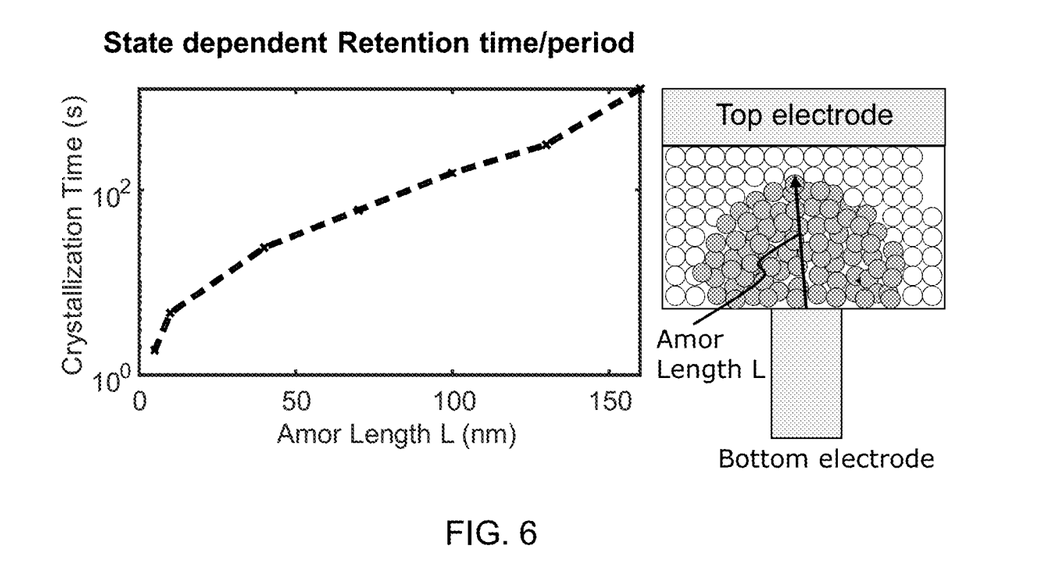
FIG. 6 illustrates the state dependent retention time of resistive elements, according to embodiments of the invention.

FIG. 6 illustrates the state dependent retention period or in other words retention time of resistive elements according to embodiments of the invention. More particularly, the x-axis denotes the amorphization length L in nm of the respective phase change element and the y-axis denotes the corresponding retention time in seconds of the second binary state/the second resistance state. The amorphization length L denotes the largest (radial) extension of the amorphous volume starting from the heating electrode. As can be derived from FIG. 6, the higher the amorphization length L, the longer the retention time.

Figure 7:
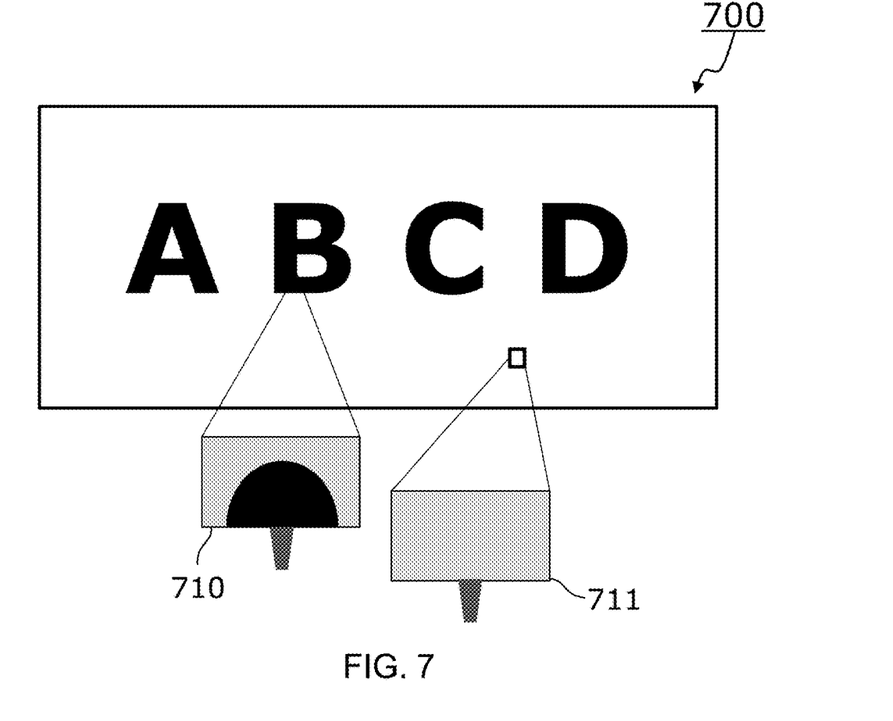
FIG. 7 shows an application of a device comprising resistive elements, according to embodiments of the invention, in the area of data security.

FIG. 7 shows an application of a device comprising resistive elements according to embodiments of the invention in the area of data security. More particularly, FIG. 7 shows a display 700 for displaying a confidential image. The display 700 is programmed to auto-destruct the respective confidential image. Every pixel of the image is associated to a phase change memory element/device. The "0" bits are only temporally stable and become "1" due to the crystallization of the phase-change material. According to this example, the "0" bits are associated to dark pixels illustrating the numbers A, B, C, and D. The "0" bits are implemented by programming a respective memory cell to a predefined amorphous volume as illustrated by a phase change memory cell 710. The "1" bits are implemented by a crystalline phase change memory cell 711.

Figure 8:
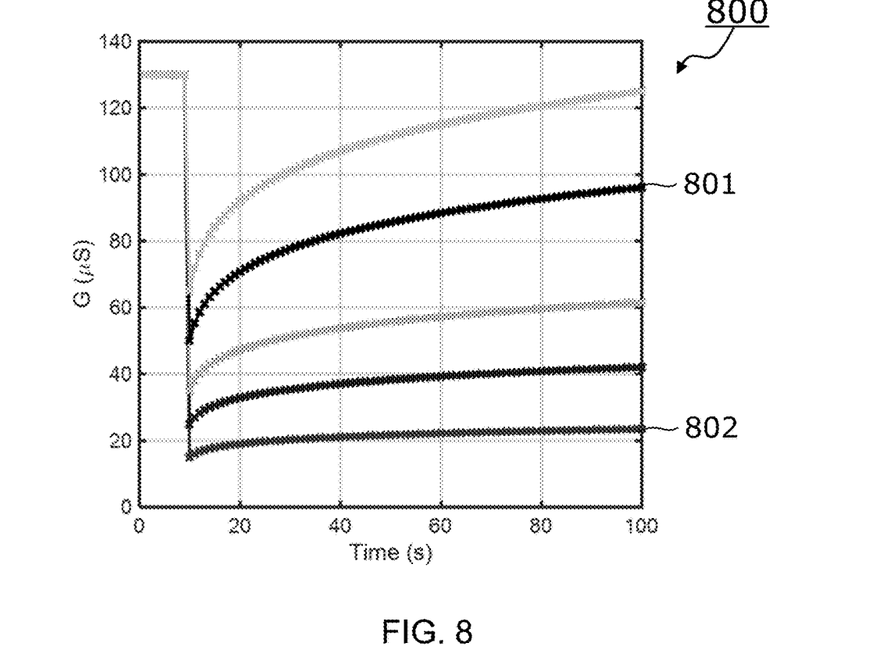
FIG. 8 shows an application of a device comprising resistive elements, according to embodiments of the invention, in the area of computational memories.

FIG. 8 shows graph 800 of an application of a device comprising resistive elements according to embodiments of the invention in the area of computational memories. More particularly, FIG. 8 shows how to implement the short-term plasticity synthetic synapses by devices according to embodiments of the invention. A PCM synapse with short-term memory property can implement biophysical mechanisms. FIG. 8 depicts an example application of short term synaptic fatigue in muscles. If the muscles are continuously active, depending on the intensity of the activity, the synapses can become less conductive and take longer to recover, thus implementing muscle fatigue.

More particularly, the x-axis denotes the time in seconds of activity of a muscle and the y-axis denotes the corresponding conductivity G in µS of the muscle. As can be derived from FIG. 6, the higher the amorphization length, the longer the retention time. As an example, the curve 801 may be implemented by means of a phase change element that is programmed to a rather small amorphous volume, while the curve 802 may be implemented by means of a phase change element that is programmed to a larger amorphous volume.

Figure 9:
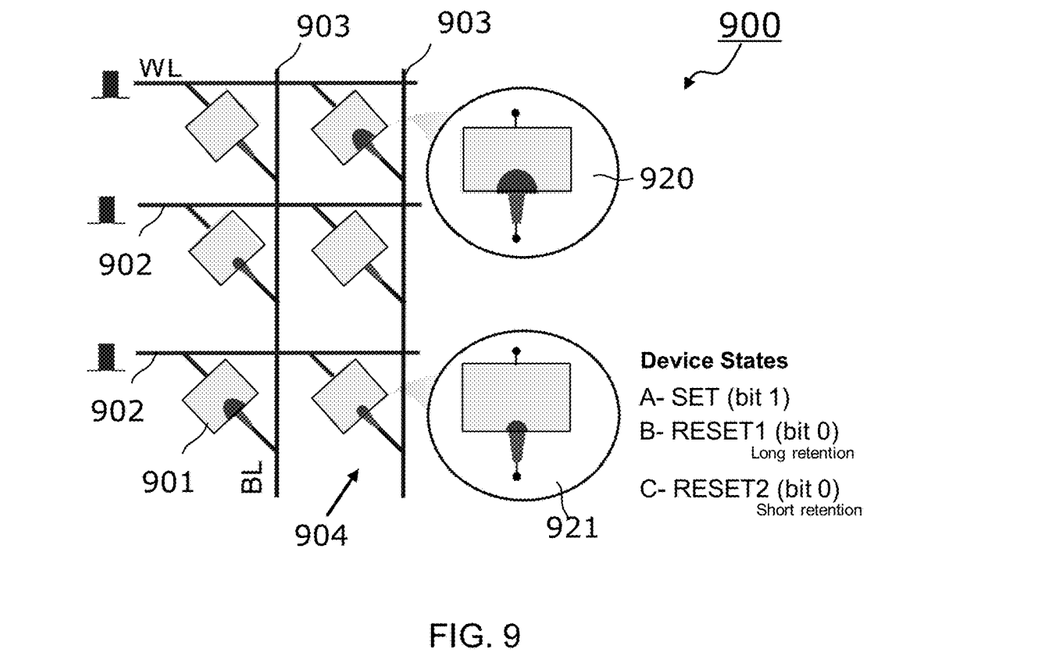
FIG. 9 shows a memory crossbar array, according to embodiments of the invention.

FIG. 9 shows a memory crossbar array 900 according to embodiments of the invention. The memory crossbar array 900 comprises a plurality of resistive elements 901 that are arranged in a crossbar array. The crossbar array comprises a plurality of row lines 902 (word lines "WL"), a plurality of column lines 903 (bit lines "BL"), and a plurality of junctions 904 arranged between the plurality of row lines 902 and the plurality of column lines 903. Each junction comprises a programmable resistive element 901 and an access element such as a transistor (not shown) for accessing the programmable resistive element. The crossbar array 900 may encompass three different device states. A first device state may be a bit "0" corresponding to a first (low) resistance state. This may also be denoted as "SET"-state. A second device state may be a bit "1" corresponding to a second (high) resistance state. The second device state is may also be denoted as "RESET 1"-state or in other words as first RESET state having a long retention period. The long retention period corresponds to a large amorphous volume as illustrated by an exemplary phase change element 920. The third device state is may also be denoted as "RESET 2"-state or in other words as second RESET state having a short(er) retention period. The short retention period corresponds to a small(er) amorphous volume as illustrated by an exemplary phase change element 921.

Figure 10:
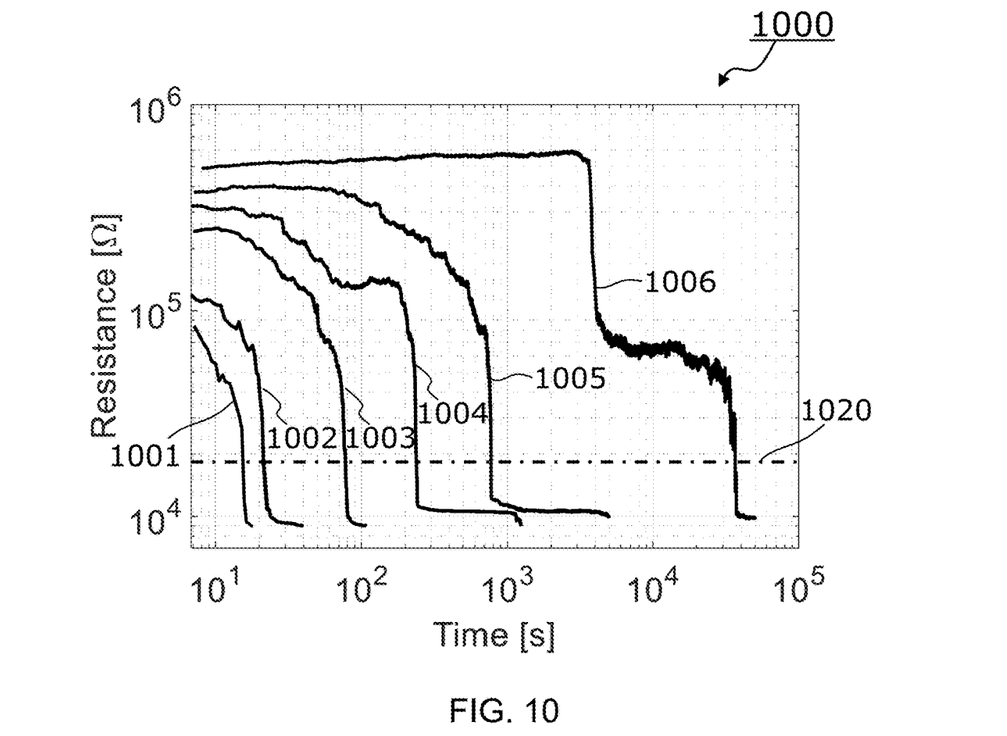
FIG. 10 shows a diagram showing exemplary retention curves of phase change elements comprising GeSb as phase change material, according to an embodiment of the invention.

FIG. 10 shows a diagram 1000 showing exemplary retention curves 1001, 1002, 1003, 1004, 1005, and 1006 of phase change elements comprising GeSb as the phase change material. The retention curves 1001-1006 have a different initial second resistance state corresponding to a different amorphous starting volume or amorphous starting lengths. The larger the amorphous starting volume/starting length, the longer the retention period. As can be seen in FIG. 10, the resistance value of the second resistance state evolves over time. As soon as the resistance state passes the reference value 1020, the corresponding resistive device reverts from the second resistance state to the first resistance state. This automatic reversal is performed by an inherent material property of the resistive material, more particularly by the crystallization dynamics of the GeSb phase change material. The automatic change of the resistance state from the second resistance state to the first resistance state automatically deletes the second binary state.

According to other embodiments, Sb, $Ge_xSb_y$, $Ga_xSb_y$, $Sb_xTe_y$, $Ge_xSb_yTe_z$, $Ge_xTe_y$, or $Ag_xIn_ySb_zTe_n$ may be used as resistive material, wherein x, y, z, and n represent atomic percentages. These materials inhibit advantageous crystallization dynamics that may be used for the implementation of short-term data retention applications. According to embodiments, the resistive material may be doped with O, N, C, $SiO_2$ or Sc. With such a doping, the crystallization dynamics and the associated data retention properties, in particular the data retention times, may be further tuned and/or adapted.

Devices according to embodiments of the invention may be configured to operate in an environment having an elevated temperature above room temperature. The elevated temperature may be in a temperature range between 25° C. and 100° C. Operating the devices and its resistive elements at such elevated temperatures may facilitate the short-term data retention characteristics of the resistive elements. According to embodiments, the environmental temperature may be used to tune the retention times of the second binary states of the resistive elements. According to embodiments, the higher the environmental temperature, the shorter the retention times of the second binary states of the resistive elements. This is due to the effect that an elevated temperature fosters the recrystallization of the amorphous volume.

According to embodiments, the predefined retention period for the second resistance state may be in a range between 1 μs and 12 hours. According to further embodiments, the predefined retention period may be even 1 day or several days.

According to embodiments, the resistive elements may be also embodied as conductive bridge resistive memory elements, metal-oxide resistive random-access memory (RRAM) elements, magneto-resistive random access memory (MRAM) elements, or ferroelectric random access memory (FeRAM) elements.

FIGS. 11A-11D show device geometries of resistive elements that may be used according to embodiments of the invention.

Figure 11A:
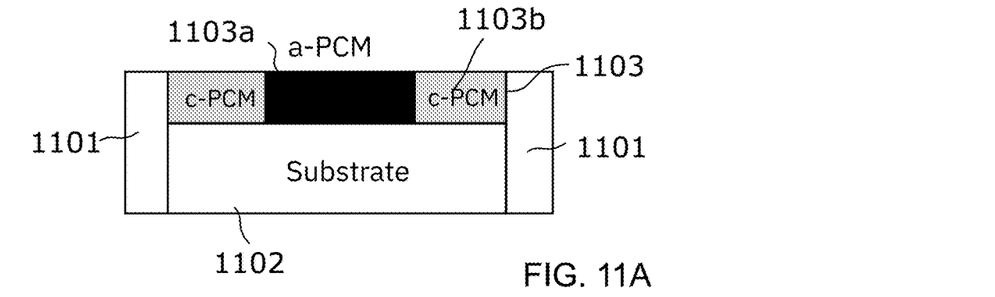
FIG. 11A shows a bridge cell.

FIG. 11A shows a bridge cell comprising a substrate 1102, electrodes 1101, and a resistive material 1103 comprising an amorphous volume 1103a and a crystalline volume 1103b.

Figure 11B:
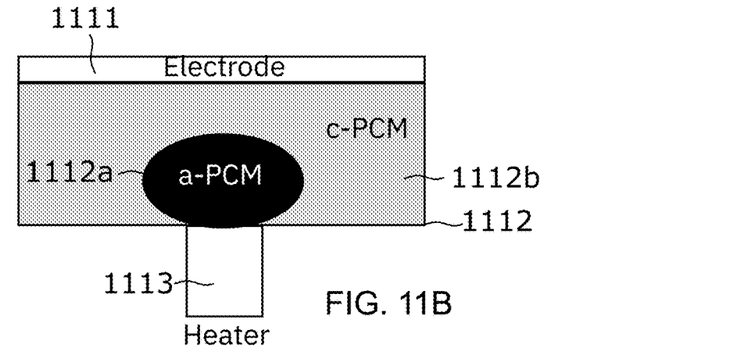
FIG. 11B shows a mushroom cell.

FIG. 11B shows a mushroom cell comprising a top electrode 1111, a resistive material 1112 comprising an amorphous volume 1112a and a crystalline volume 1112b, and a heater 1113.

Figures 11C, 11D:
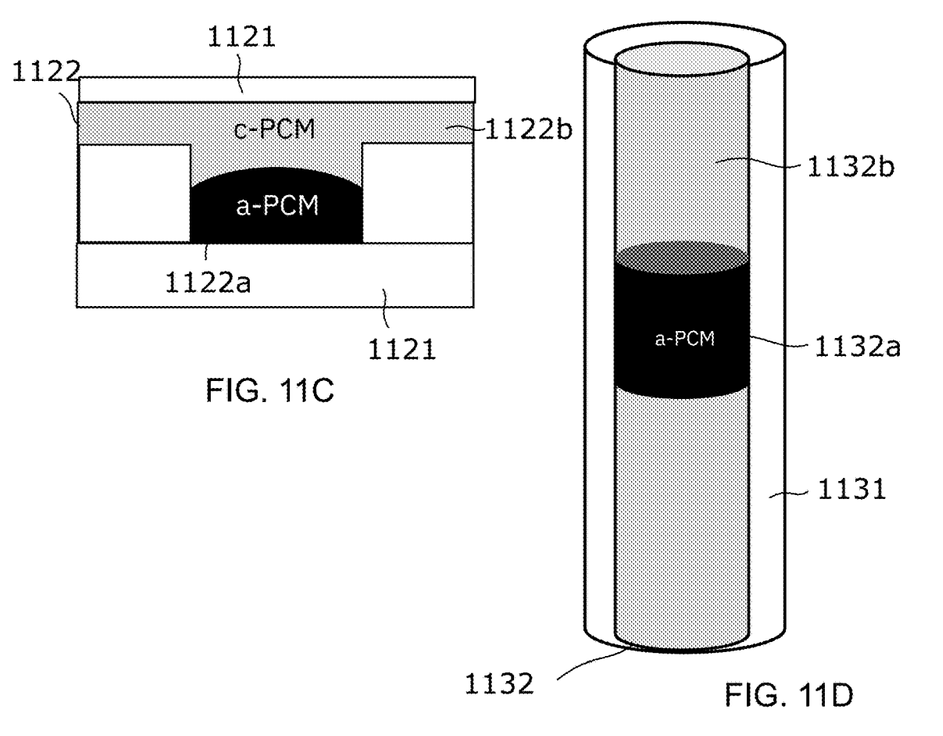
FIG. 11C shows a trench cell.
FIG. 11D shows a confined cell.

FIG. 11C shows a trench cell comprising electrodes 1121 and a resistive material 1122 comprising an amorphous volume 1122a and a crystalline volume 1122b.

FIG. 11D shows a confined cell comprising a substrate 1131 and a resistive material 1132 comprising an amorphous volume 1132a and a crystalline volume 1132b.

Figure 12:
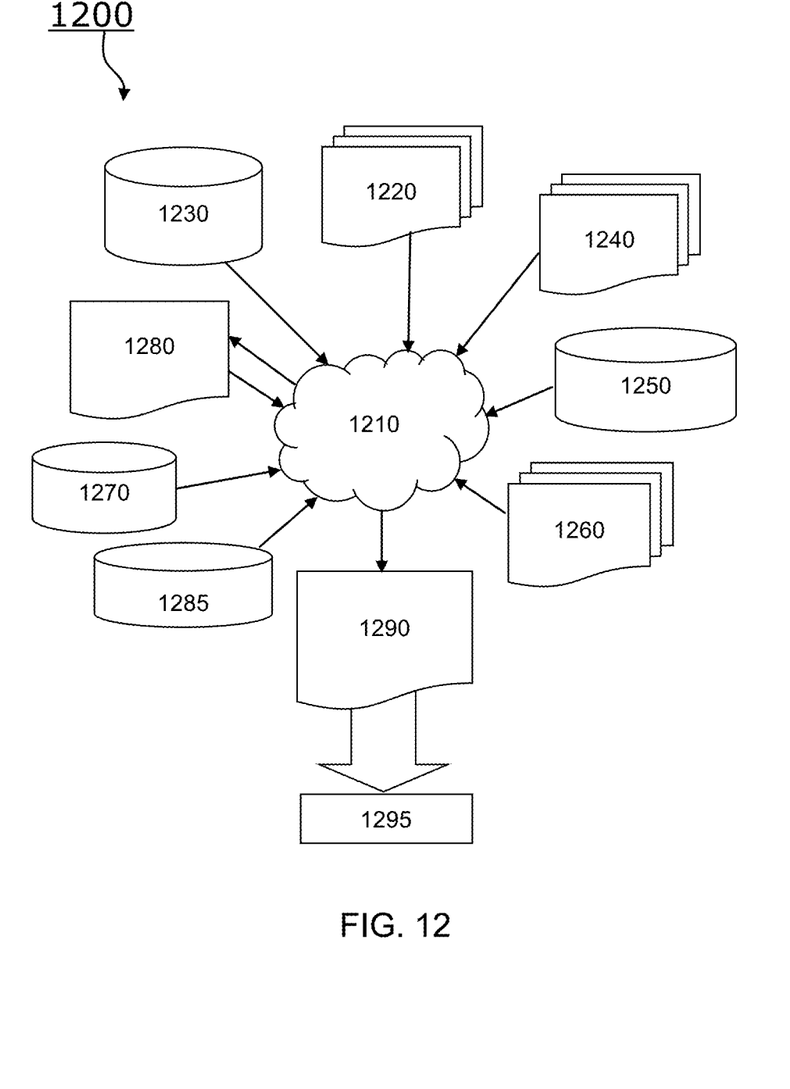
FIG. 12 shows a block diagram of an exemplary design flow, according to an embodiment of the invention.

FIG. 12 shows a block diagram of an exemplary design flow 1200 used, e.g., in semiconductor IC logic design, simulation, test, layout, and manufacture. Design flow 1200 includes processes, machines and/or mechanisms for processing design structures or devices to generate logically or otherwise functionally equivalent representations of the design structures and/or devices described above and shown, e.g., in FIGS. 1-11D. The design structures processed and/or generated by design flow 1200 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 1200 may vary depending on the type of representation being designed. For example, a design flow 1200 for building an application specific integrated circuit (ASIC) may differ from a design flow 1200 for designing a standard component or from a design flow 1200 for instantiating the design into a programmable array, e.g., a programmable gate array (PGA) or a field programmable gate array (FPGA).

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that, when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a machine-readable data transmission, gate array, or storage medium, design structure 1220 may be accessed and processed by one or more hardware and/or software modules within design process 1210 to simulate or otherwise functionally represent an electronic component, circuit, electronic or logic module, apparatus, device, or system such as those shown in FIGS. 1-11D. As such, design structure 1220 may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1210 preferably employs and incorporates hardware and/or software modules for synthesizing, translating, or otherwise processing a design/simulation functional equivalent of the components, circuits, devices, or logic structures shown in FIGS. 1-11D to generate a Netlist 1280 that may contain design structures such as design structure 1220. Netlist 1280 may comprise, e.g., compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1210 may include hardware and software modules for processing a variety of input data structure types including Netlist 1280. Such data structure types may reside, e.g., within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285, which may include input test patterns, output test results, and other testing information. Design process 1210 may further include, e.g., standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc.

Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11D. In one embodiment, design structure 1290 may comprise a compiled, executable HDL simulation model that functionally simulates the devices shown in FIGS. 1-11D.

Design structure 1290 may also employ a data format used for the exchange of layout data of integrated circuits and/or symbolic data format (e.g., information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11D. Design structure 1290 may then proceed to a stage 1295 where, e.g., design structure 1290 proceeds to tape-out, is released to manufacturing, is released to a mask house, is sent to another design house, is sent back to the customer, etc.

Figure 13:
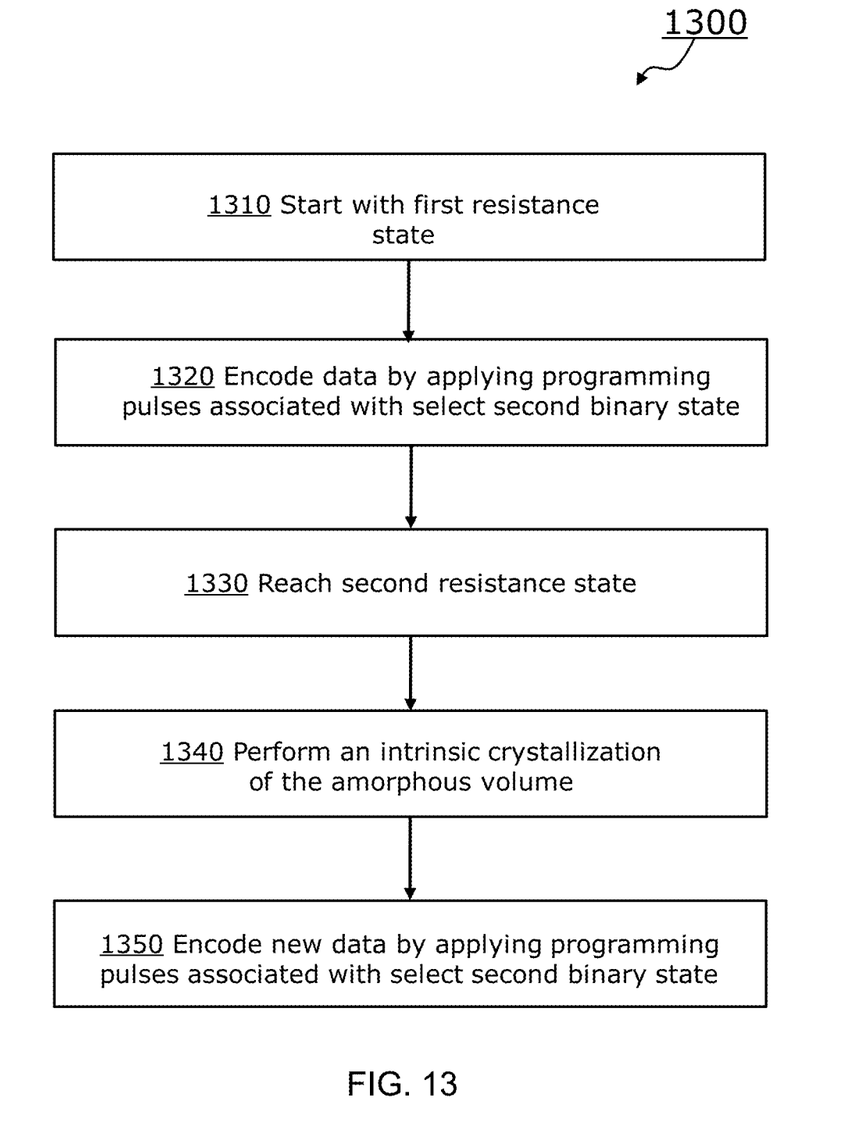
FIG. 13 shows a flow chart of method steps of a method for performing a short-term retention of data by a device comprising a plurality of resistive elements, according to an embodiment of the invention.

FIG. 13 shows a flow chart 1300 of method steps of a method for performing a short-term retention of data by a device comprising a plurality of resistive elements. The method may be performed, e.g., by means of devices according to embodiments of the invention, e.g., by the device 100 as shown in FIG. 1.

The method starts at a step 1310 with one or more of the resistive elements having a first resistance state corresponding to a first binary state, in particular a low resistance state.

At a step 1320, the method comprises a step of encoding data by applying one or more programming pulses associated with select second binary state to a subset of the plurality of resistive elements to perform a temporary resistance change of the resistive material of the subset for a predefined retention period. This step may encompass an iterative write and verify procedure.

As a result of the step 1320, the subset of the plurality of resistive elements has been programmed to and hence reached, at a step 1330, a second resistance state corresponding to a second binary state, in particular a high resistance state, i.e., a higher resistance state that in step 1310.

At a step 1340, the resistive elements are automatically crystallized by the inherent crystallization dynamics of the resistive material, but without any application of further pulses such as erase pulses. In other words, the step 1340 allows the binary state to flip due to the intrinsic crystallization property. The crystallization may only be fostered by operating the device in an environment of an elevated temperature.

As a result of the automatic crystallization of step 1340, the device has automatically returned or reverted from the second resistance state to the first resistance state and has thereby automatically deleted the second binary state.

At a step 1350, new data may be encoded by applying programming pulses associated with select second binary state.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A device comprising a plurality of resistive elements, the plurality of resistive elements comprising a resistive material, the device being configured to apply programming pulses to a subset of the plurality of resistive elements to perform a temporary resistance change of the resistive material of the subset for a predefined retention period, thereby programming the subset of the plurality of resistive elements from a first resistance state corresponding to a first binary state to a second resistance state corresponding to a second binary state, wherein the device is configured such that a resistance of the resistive material of the subset of the plurality of resistive elements reverts automatically after the predefined retention period from the second resistance state to the first resistance state by an inherent material property of the resistive material, thereby automatically deleting the second binary state.

2. The device according to claim 1, wherein:
the plurality of resistive elements are phase change elements, and the resistive material is a phase change material; programming the subset of the plurality of resistive elements from the first resistance state to the second resistance state comprises performing a temporary amorphization of the phase change material, thereby creating an amorphous volume; the inherent material property is a crystallization dynamic of the phase change material;
and the device is configured such that the resistance of the subset of the plurality of resistive elements reverts automatically from the second resistance state to the first resistance state by a crystallization of the amorphous volume.

3. The device according to claim 2, wherein:
the device is configured to tune the predefined retention period of the plurality of resistive elements by programming the subset of the plurality of resistive elements to a plurality of different amorphous volumes.

4. The device according to claim 1, wherein the device is configured to program the subset of the plurality of resistive elements to a plurality of second binary states with different retention periods.

5. The device according to claim 1, wherein the resistive material is selected from the group consisting of: Sb, $Ge_xSb_y$, $Ga_xSb_y$, $Sb_xTe_y$, $Ge_xSb_yTe_z$, $Ge_xTe_y$, and $Ag_xIn_ySb_zTe_n$, wherein x, y, z, and n represent atomic percentages.

6. The device according to claim 5, wherein the resistive material is doped with a material selected from the group consisting of: O, N, C, $SiO_2$, and Sc.

7. The device according to claim 1, wherein the device is configured to operate in an environment having an elevated temperature above room temperature.

8. The device according to claim 7, wherein the elevated temperature is in a temperature range between 25° C. and 100° C.

9. The device according to claim 1, wherein the predefined retention period is in a range between 1 μs to 12 hours.

10. The device according to claim 1, wherein the plurality of resistive elements are selected from the group consisting of: Phase change memory (PCM) elements, Conductive bridge resistive memory elements, Metal-oxide resistive random-access memory (RRAM) elements, Magneto-resistive random access memory (MRAM) elements, and Ferroelectric random access memory (FeRAM) elements.

11. The device according to claim 1, wherein the device is embodied as a computational memory device.

12. The device according to claim 1, wherein the device is embodied as a short-term memory device.

13. The device according to claim 1, wherein a geometry of the plurality of resistive elements is selected from the group consisting of: a bridge cell, a mushroom cell, a trench cell, and a confined cell.

14. The device according to claim 1, wherein the plurality of resistive elements is arranged in a crossbar array, the crossbar array comprising a plurality of row lines, a plurality of column lines, and a plurality of junctions arranged between the plurality of row lines and the plurality of column lines, wherein each junction comprises a programmable resistive element and an access element for accessing the programmable resistive element.

15. The device according to claim 1, wherein the device comprises a signal generator, the signal generator being configured to program the resistance of the plurality of resistive elements by an iterative program and verify procedure.

16. A design structure tangibly embodied in a machine readable medium for designing, manufacturing, or testing an integrated circuit, the design structure comprising a device comprising a plurality of resistive elements, the plurality of resistive elements comprising a resistive material, the device being configured to apply programming pulses to a subset of the plurality of resistive elements to perform a temporary resistance change of the resistive material of the subset for a predefined retention period, thereby programming the subset of the plurality of resistive elements from a first resistance state corresponding to a first binary state to a second resistance state corresponding to a second binary state, wherein the device is configured such that a resistance of the resistive material of the subset of the plurality of resistive elements reverts automatically after the predefined retention period from the second resistance state to the first resistance state by an inherent material property of the resistive material, thereby automatically deleting the second binary state.

17. The design structure according to claim 16, wherein:
the plurality of resistive elements are phase change elements and the resistive material is a phase change material; programming the subset of the plurality of resistive elements from the first resistance state to the second resistance state comprises performing a temporary amorphization of the phase change material, thereby creating an amorphous volume; the inherent material property is a crystallization dynamic of the phase change material;

and the device is configured such that the resistance of the subset of the plurality of resistive elements reverts automatically from the second resistance state to the first resistance state by a crystallization of the amorphous volume.

18. A method for performing a short-term retention of data by a device comprising a plurality of resistive elements, the plurality of resistive elements comprising a resistive material, the method comprising:

applying programming pulses to a subset of the plurality of resistive elements to perform a temporary resistance change of the resistive material of the subset for a predefined retention period, thereby programming the subset of the plurality of resistive elements from a first resistance state corresponding to a first binary state to a second resistance state corresponding to a second binary state; and automatically reverting after the predefined retention period from the second resistance state to the first resistance state by an inherent material property of the resistive material, thereby automatically deleting the second binary state.

19. The method according to claim 18, wherein:

the plurality of resistive elements are phase change elements and the resistive material is a phase change material, and the step of programming the subset of the plurality of resistive elements from the first resistance state to the second resistance state comprises performing a temporary amorphization of the phase change material, thereby creating an amorphous volume, wherein the inherent material property is a crystallization dynamic of the phase change material; and further comprising:

crystallizing the amorphous volume by performing an intrinsic crystallization of the amorphous volume, thereby reverting a resistance of the subset of the plurality of resistive elements automatically from the second resistance state to the first resistance state.

20. The method according to claim 19, further comprising:

tuning the predefined retention period of the plurality of resistive elements by programming the subset of the plurality of resistive elements to a plurality of different amorphous volumes.

* * * * *